United States Patent [19]

Gardner et al.

[11] Patent Number: 5,316,488

[45] Date of Patent: May 31, 1994

[54] CONNECTOR APPARATUS FOR IC PACKS

[75] Inventors: Michael J. Gardner, Pleasanton; Jerry D. Kachlic, Milpitas, both of Calif.; Paul M. O'Brien, County Clare, Ireland

[73] Assignee: Molex Incorporated, Lisle, Ill.

[21] Appl. No.: 71,799

[22] Filed: Jun. 4, 1993

[51] Int. Cl.5 .............................................. H01R 9/09
[52] U.S. Cl. ...................................... 439/79; 439/540
[58] Field of Search ............................... 439/152–160, 439/372, 717, 709, 329, 79, 540

[56] References Cited

U.S. PATENT DOCUMENTS

| D. 320,003 | 9/1991 | Komatsu | D13/147 |
|---|---|---|---|
| 4,592,161 | 8/1990 | Komatsu | 439/329 |
| 5,026,296 | 6/1991 | Hashiguchi | 439/159 |
| 5,030,115 | 7/1991 | Regnier et al. | 439/540 |
| 5,106,315 | 4/1992 | Billman et al. | 439/160 |
| 5,115,376 | 5/1992 | Nakajima | 439/160 |
| 5,149,276 | 9/1992 | Dixon | 439/159 |
| 5,152,697 | 10/1992 | Abe et al. | 439/152 |
| 5,176,523 | 1/1993 | Lai | 439/540 |
| 5,197,894 | 3/1993 | Koike | 439/159 |

Primary Examiner—David L. Pirlot
Attorney, Agent, or Firm—Stacey E. Caldwell

[57] ABSTRACT

A connector apparatus is disclosed for providing interconnection between two IC packs and a printed circuit board. A header connector is mounted on the printed circuit board and into which the two IC packs are inserted and ejected. Two independent ejector units each have a separate frame to be attached to the header connector and a separate actuator for moving a respective one of the IC packs from its inserted position to its ejected position. Complementary interengaging latches are provided between the separate frames for holding the ejector units in juxtaposition for conjoint attachment to the header connector.

11 Claims, 5 Drawing Sheets

CONNECTOR APPARATUS FOR IC PACKS

FIELD OF THE INVENTION

This invention generally relates to the art of electrical connectors and, particularly, to a connector apparatus for providing interconnection between two IC packs and a printed circuit board.

BACKGROUND OF THE INVENTION

A conventional connector apparatus for an IC pack or memory card includes a generally U-shaped frame having a pair of guide grooves inside a pair of side frame portions, with a connector section joining or extending between the side frame portions. A planar IC pack is inserted into the apparatus within the side guide grooves. A transverse array of socket terminals at an edge of the IC pack electrically connect an associated array of pin terminals on the connector section.

Such connector apparatus often are provided as header connectors used for interconnecting the semiconductor circuit of the IC pack to an external circuit such as a main electronic unit. The header connector may be used with an IC pack or memory card for removably coupling the IC pack to a printed circuit board. The IC pack is inserted into the header connector and is extracted therefrom as needed. The extraction force of the IC pack, i.e. the force between the respective terminal pins on the header connector and the respective socket terminals of the IC pack, is relatively high due to the tight fit required to obtain a good electrical interconnection between the terminals. These terminals typically are disposed at a high density which further increases the extraction forces. Often, when an IC pack is to be extracted from a header connector, the card is grasped by a user and simply pulled out.

Consequently, a variety of ejecting mechanisms have been incorporated in various connector apparatus, such as the header connectors, for facilitating ejecting an IC pack from a header connector. Such ejecting mechanisms have been incorporated as integral or unitary devices fabricated as part of the connector apparatus or header connector, itself. On the other hand, separate ejecting mechanisms have been provided for assembly to the header connector, such as after the header connector has been coupled to a printed circuit board.

Still further, connector apparatus have been provided for interconnection between a plurality of IC packs and a main electronic unit, such as through a printed circuit board or other circuit element. In essence, one such connector apparatus includes a dual header connector for mounting on a printed circuit board and into which a pair of IC packs are inserted and ejected. The IC packs are inserted in a generally parallel or stacked condition. An example of such a dual connector apparatus is shown in U.S. Patent No. Des. 320,003 to Komatsu, dated Sep. 17, 1991. That patent shows a dual connector apparatus wherein a pair of ejecting mechanisms are formed integral with the header connector itself for independently ejecting the two IC packs from the apparatus.

There are various problems with connector apparatus designed to accommodate a plurality of stacked IC packs, such as the dual header connector described above. Specifically, when the plural ejecting mechanisms are integral portions of the dual header connector apparatus itself, all of the moving parts of the ejecting mechanisms are subjected to the harsh processing parameters of the soldering process when the Connector apparatus is coupled to a printed circuit board. Therefore, the various moving components of the ejecting mechanisms must be fabricated of expensive material which can withstand these harsh processing parameters. In addition, the use of such unitary structures, i.e. the ejecting mechanism integral with the header connector apparatus, makes it very expensive to accommodate IC packs of different thicknesses. In other words, the entire combined assembly of the header connector portion and the ejecting mechanism portion must be fabricated for a particular IC pack thickness.

It might be suggested to provide such dual connector apparatus with separate or independent ejecting mechanisms for the respective IC packs. However, such a multi-component connector apparatus is difficult to assemble and handle versus the unitary construction of connector apparatus as shown in the U.S. Pat. No. Des. 320,003 patent.

This invention is directed to solving the various problems outlined above by providing a connector apparatus for accommodating a plurality of IC packs, with separate ejecting mechanisms for each pack independent of the header connector, and with latch means for interconnecting the ejecting mechanisms to facilitate handling thereof and assembly into the connector apparatus.

SUMMARY OF THE INVENTION

An object, therefore, of the invention is to provide a new and improved connector apparatus for providing interconnection between a plurality of IC packs or memory cards and an electronic unit, and including an improved IC pack ejector means therefor.

In the exemplary embodiment of the invention, the connector apparatus is provided for interconnection between a pair of IC packs and a printed circuit board. However, it is contemplated that the connector apparatus of the invention be used to connect a pair of IC packs or memory cards to any other circuit element, including a flat flex cable or another connector. The disclosed apparatus includes a header connector means for mounting on the printed circuit board or other circuit element and into which two IC packs are inserted and from which they are ejected. Ejector means are mounted on the header connector means and include actuator means for moving the IC packs from inserted positions to ejected positions.

The invention contemplates that the ejector means include two independent ejector units each having a separate frame to be attached to the header connector means and a separate actuator for moving a respective one of the IC packs from its inserted position to its ejected position. Generally, complementary interengaging latch means are provided on the separate frames for holding the ejector units in juxtaposition for conjoint attachment to the header connector means.

As disclosed herein, the complementary interengaging latch means are provided by snap-latch devices projecting from the frame of one of the ejector units, along with a latch surface on the frame of the other ejector unit for latchingly engaging the snap-latch device. The ejector units preferably are manufactured as identical units, positioned in a mirror image relationship with respect to each other, and at least one of the snap-latch devices and at least one of the latch surfaces are provided on each ejector unit. In such a configuration, a minimum number of components are required.

Still further, the frames of the ejector units are disclosed herein as molded of dielectric material such as plastic or the like. The snap-latch devices are provided as resilient, integrally molded latch arms projecting from the frame of the ejector units. The ejector units are generally rectangular, with one end of each unit being adapted to receive one of the IC packs and an opposite end adapted to be attached to the header connector means. At least one latch arm and at least one latch surface are spaced along each opposite side of each unit between the ends thereof.

Other objects, features and advantages of the invention will be apparent from the following detailed description taken in connection with the accompanying drawings.

BRIEF DESCRIPTION OF THE DRAWINGS

The features of this invention which are believed to be novel are set forth with particularity in the appended claims. The invention, together with its objects and the advantages thereof, may be best understood by reference to the following description taken in conjunction with the accompanying drawings, in which like reference numerals identify like elements in the figures and in which:

DETAILED DESCRIPTION OF THE PREFERRED EMBODIMENT

Figure 1:
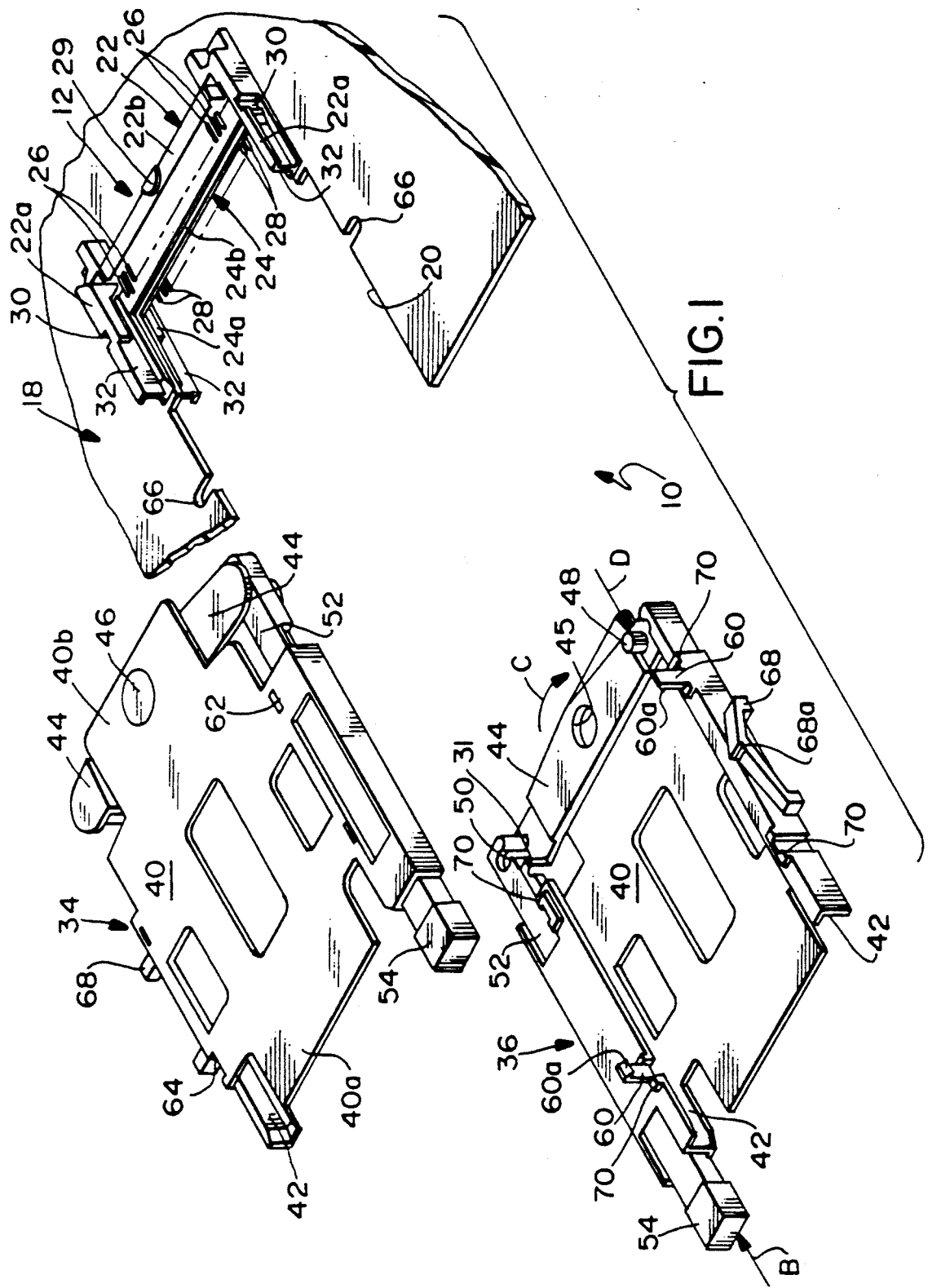
FIG. 1 is an exploded perspective view of the connector apparatus of the invention, including a header connector means mounted to a printed circuit board and a pair of interlatchable ejector units.
Figure 2:
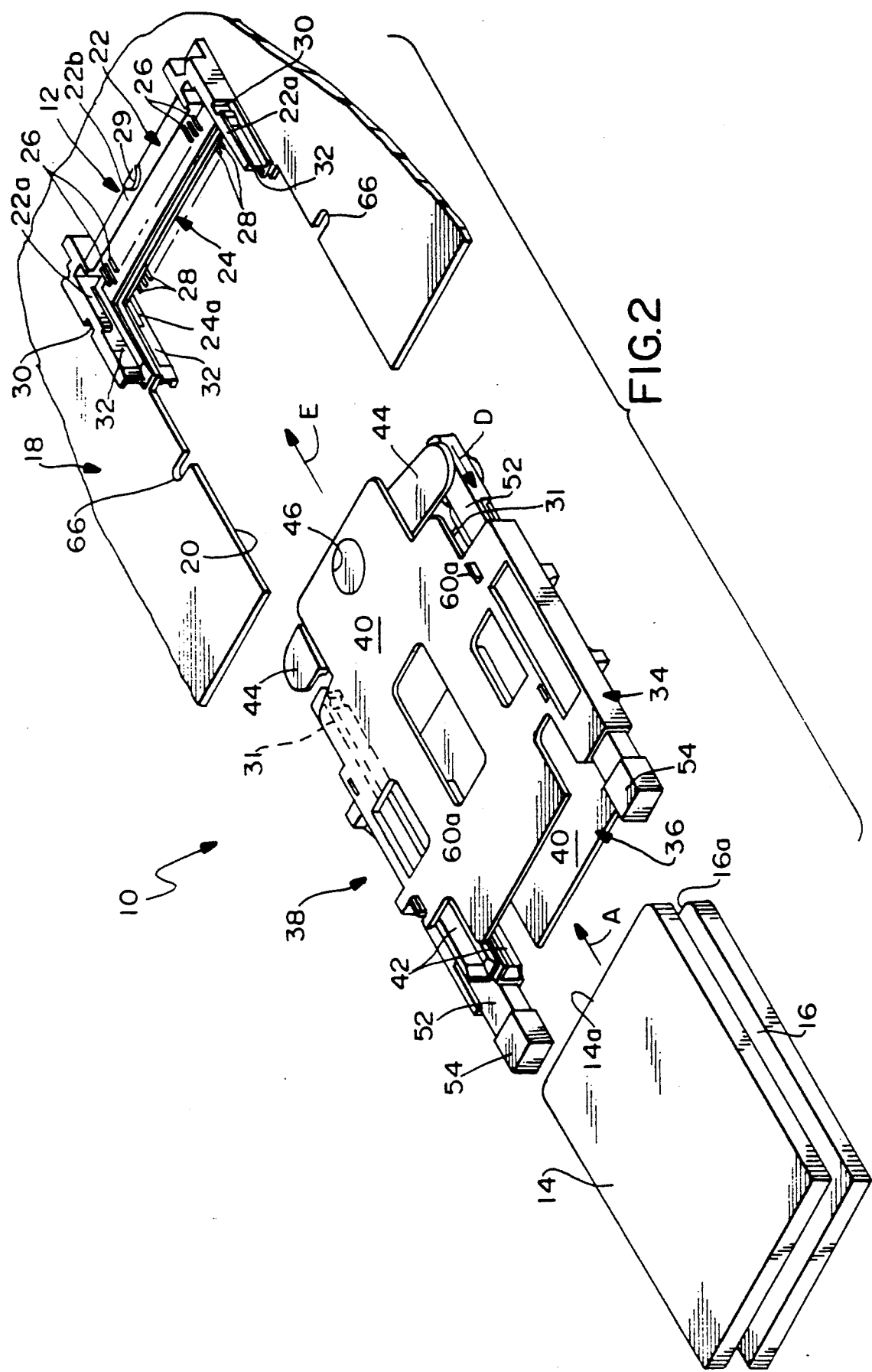
FIG. 2 is a view similar to that of FIG. 1, with the ejector units latched together, and illustrating a pair of IC packs.

Referring to the drawings in greater detail, and first to FIGS. 1 and 2, the invention is embodied in a connector apparatus, generally designated 10, which includes a header connector means, generally designated 12, for providing interconnection between a pair of IC packs or memory cards 14 and 16 (FIG. 2) and a printed circuit board Header connector means 12 are designed for straddle-mounting printed circuit board 18, for example, at the base of a cut-out or opening 20 in the board as shown in FIG. 1. In this way, the connector apparatus may accommodate Type I, Type II, or Type III memory cards. The header connector means includes an upper header connector, generally designated 22, and a lower header connector, generally designated 24, which may be, and preferably are, identically configured. The upper header connector includes a dielectric frame defined by a pair of side frame portions 22a joined by a connector section 22b mounting a plurality of terminals 26 connected to circuit traces on the upper surface of printed circuit board 18, as by soldering. Similarly, lower header connector 24 includes a frame having side frame portions 24a joined by a connector section 24b which mounts a plurality of terminals 28 connected to circuit traces on the lower surface of printed circuit board 18, as by soldering. Side frame portions 22a of upper header connector 22 and side frame portions 24a of lower header connector 24 include latch interengagement with inside latch means 31 of the ejector units, described in detail below. Lastly, side frame portions 22a of upper header connector 22 and side frame portions 24a of lower header connector 24 include guide grooves 32 on the inside thereof for guiding IC packs 14 and 16 into the header connectors, whereby socket terminals (not shown) in forward edges 14a and 16a of the IC packs interengage with pin terminals 26 and 28 of the header connectors. Pivot boss 29 may be integrally molded on each of connector section 22b and 24b for pivotal interengagement with ejector lever 44, described below.

It should be understood that the precise details of header connectors 22 and 24 are not described herein, because such header connectors, including the means for mounting the connectors to the printed circuit board, the interconnection of the terminals with the socket terminals of the IC packs, and the sliding insertion and withdrawal of the IC packs, all are well known in the art.

Generally, the invention is directed to a new and improved ejector means mountable to header connector means 12 and having actuator means for moving IC packs 14 and 16 from inserted positions to ejected positions, as illustrated hereinafter. More particularly, the ejector means of the invention are provided by two independent ejector units, generally designated 34 and 36, as best seen in FIG. 1. The ejector units are interengageable into a single assembly, generally designated 38, as best seen in FIG. 2. The ejector units are identical units positioned in a mirror image relationship with respect to each other, whereby the bottom or outside of ejector unit 36 is identical to the outside or top of ejector unit 34 which is clearly shown in FIGS. 1 and 2. Likewise, the bottom or inside of ejector unit 34 is identical to the top or inside of ejector unit 36 as is also shown in FIGS. 1 and 2. Accordingly, a minimum number of differing components are required, since each ejector unit, and header connector, may be of identical construction.

The ejector units are of generally known construction in that each unit includes a generally rectangular frame 40 having one end 40a adapted to receive one of the IC packs and an opposite end 40b adapted to be attached to adjacent header connector means 12. Guide grooves 42 are provided along opposite side edges of frame 40 and into which the IC packs can be inserted in the direction of arrow "A" (FIG. 2). An ejector lever 44 is pivotally mounted, as at 46, to frame 40. One end of the lever includes an ejector pin 48 for engaging the front edge 14a or 16a of the respective IC pack which is inserted into the particular ejector unit. The opposite end of ejector lever 44 is interengaged by a pin-and-socket pivot connection 50 to the inner end of an actuator rod 52 having a push button 54 at its outer end.

In operation, and referring particularly to lower ejector unit 36 in FIG. 1, when actuator rod 52 is pushed in the direction of arrow "B", ejector lever 44 will pivot in the direction of arrow "C" within frame 40 and around pivot boss 29, driving ejector pin 48 in the direction of arrow "D", whereupon the pin will engage edge 16a of lower IC pack 16 (FIG. 2) to eject the IC pack from lower header connector 24. Likewise, the same operation is effective by pushing actuator rod 52 of upper ejector unit 34 to eject the upper IC pack 14.

Generally, the invention contemplates the provision of complementary interengaging latch means between the two independent ejector units 34 and 36 for assembling and holding the ejector units in juxtaposition as shown in FIG. 2, and for conjoint attachment or assembly of the packet 38 to header connector means 12. More particularly, the frames of ejector units 34 and 36 preferably are molded of plastic or like material. The complementary interengaging latch means are provided with integrally molded latch arms 60 (FIG. 1) projecting from the inside of the frames of each ejector unit toward the other ejector unit. Keep in mind that the ejector units are identical units positioned in a mirror image relationship with respect to each other. Each latch arm 60 has a snap-latch hook 60a at its distal end. Standoffs 70, are located on frame 70, as seen in FIG. 1, to provide locations of support between the ejector units in their assembled condition. Each frame 40 of ejector units 34 and 36 include latch surfaces provided by a hole 62 and a shoulder 64 behind which snap-latch hooks 60a of latch arms 60 interengage when the ejector units are assembled from the positions shown in FIG. 1 to the positions shown in FIG. 2. Snap-latch hooks 60a of the latch arms of ejector unit 36 are shown engaging the latch surfaces of frame 40 of upper ejector unit 34 in FIG. 2.

In assembling the entire connector apparatus 10 and more particularly in attaching the ejector means to the head connector means, ejector units 34 and 36 (FIG. 1) are latchingly interengaged as shown in FIG. 2 to provide a single assembly 38. This assembly of ejector units then is attached to header connector means 12 in the direction of arrow "E" (FIG. 2) to the condition shown in FIG. 3 until inside latch means 31 of each ejector unit lock behind latch means 30 of header connectors 22 and 24. As seen with side board-locking means 68, including a board latch hook 68a for providing a latching engagement to printed circuit board 18. Corresponding latching surfaces are provided on printed circuit board 18 by way of board notches 66 adjacent the printed circuit board cut-out or opening 20.

Figure 3:
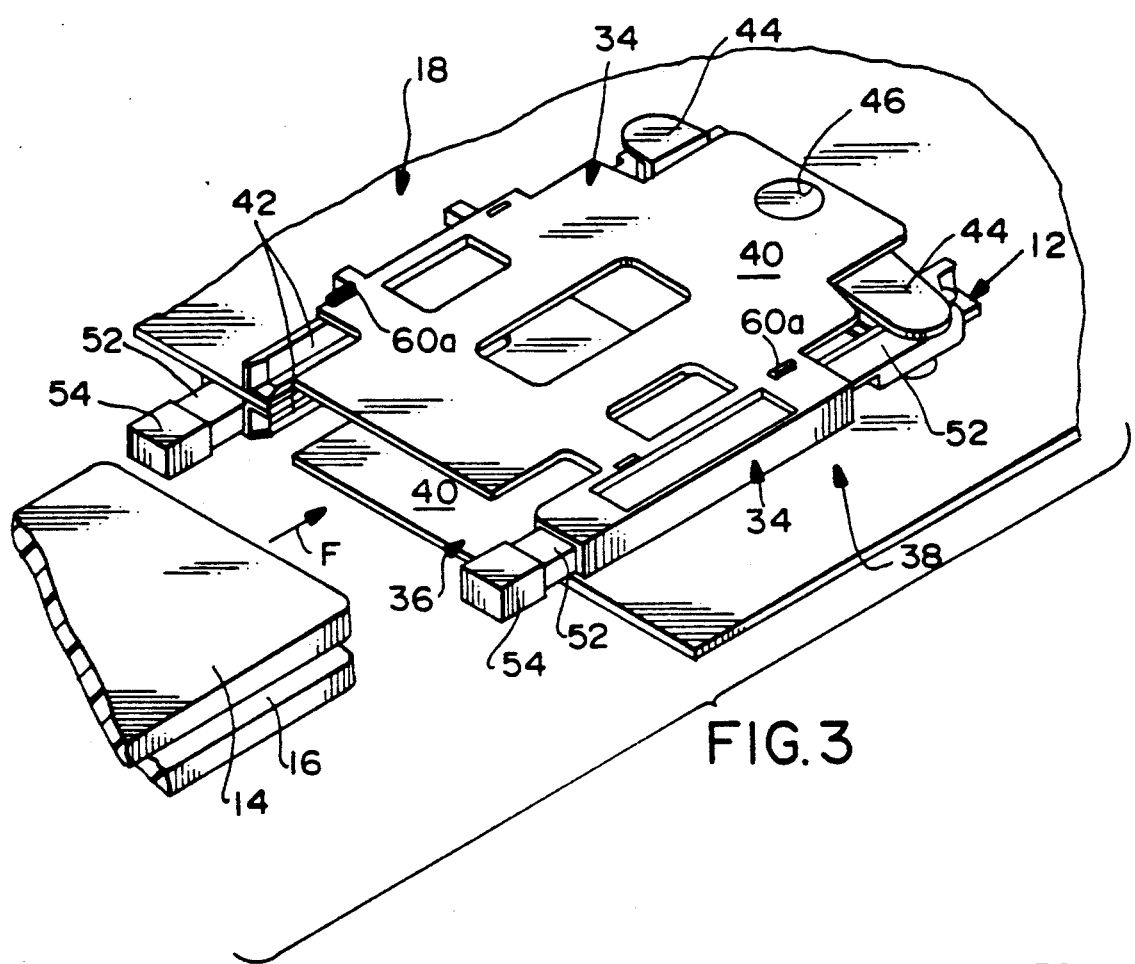
FIG. 3 is a view similar to that of FIG. 2, with the interlatched ejector units mounted on the header connector means.
Figure 4:
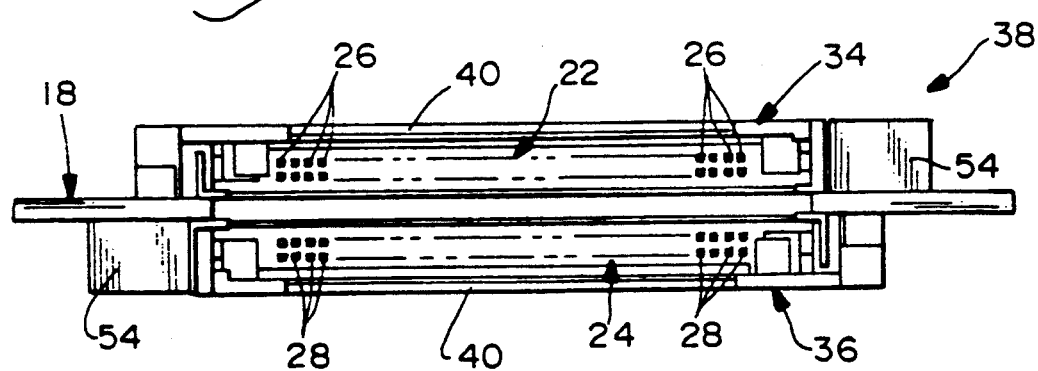
FIG. 4 is a front elevational view looking into the end of the ejector units which receive the IC packs.

FIG. 4 is a view looking into the open or unloaded ejector units and header connector means. IC packs 14 and 16 (FIG. 3) then are inserted into ejector units 34 and 36, respectively, in the direction of arrow "F" (FIG. 3). It can be seen from FIGS. 1–4 that printed circuit board 18 generally is of a given thickness and as such would accommodate a standard header/ejector unit configuration. However, if the printed circuit board is of a non-standard or custom thickness, the invention contemplates that, since guide grooves 42 accept all three standard types of memory cards, merely changing the location of latch hook 60a along molded latch arm 60 allows the ejector units to be attached to header means mounted on any thickness printed circuit board. Correspondingly, standoffs 70 may be modified in height to provide the requisite support. That is to say, the spacing between the standoff and the latch hook 60a latching surface must be such that they establish a spacing between the ejector units which corresponds with the thickness of the required printed circuit board. Accordingly, merely by changing relatively simple inserts on an injection mold, the connector apparatus can be used on any of a variety of different thickness printed circuit boards.

Figure 5:
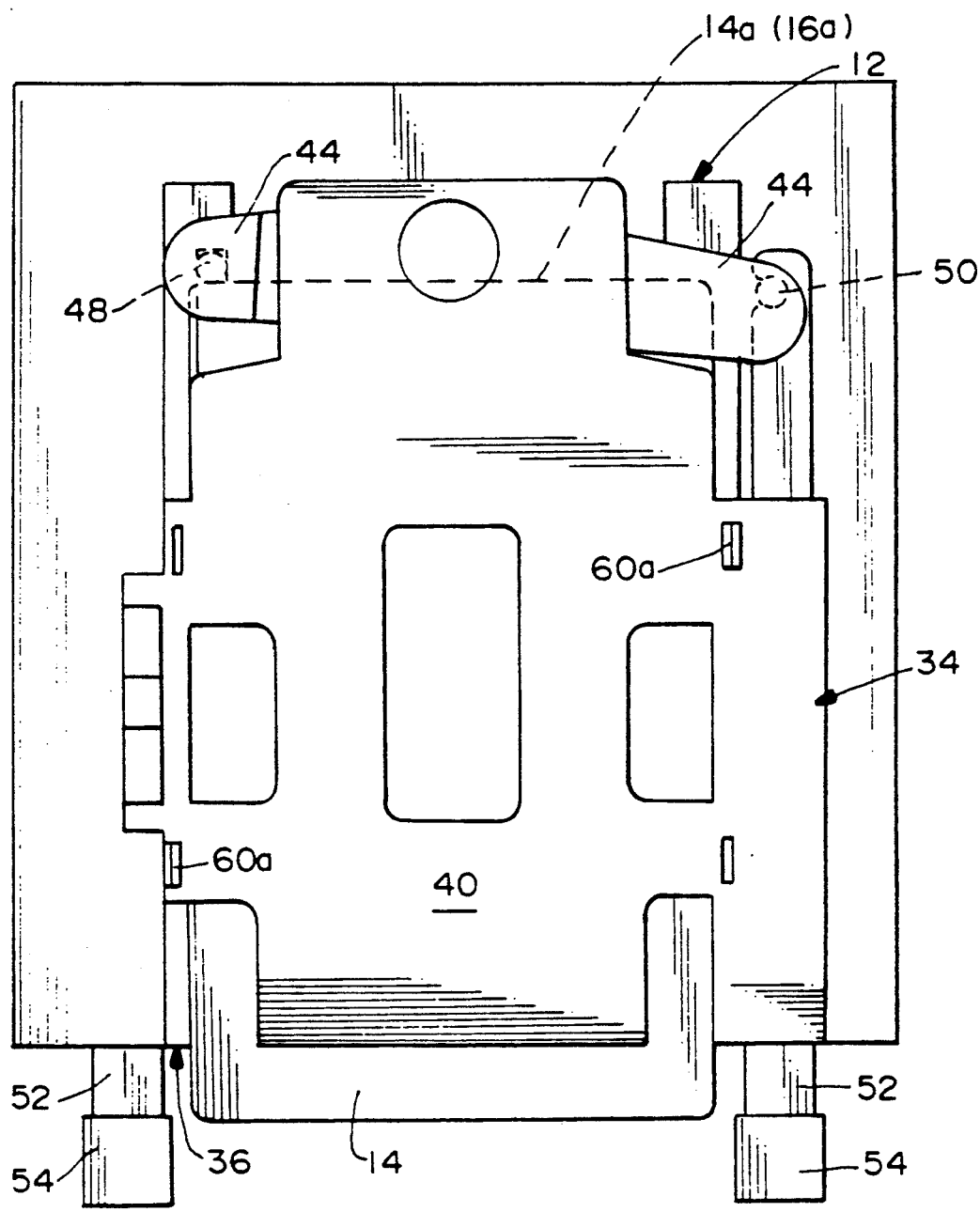
FIG. 5 is a top plan view of the completely assembled connector apparatus, with the IC packs inserted thereinto.

FIG. 5 shows a plan view of the fully assembled connector apparatus, with the IC packs inserted or loaded into the header connector means, and with actuator rods 52 of the ejector units in their inoperative positions, with push buttons 54 spaced outwardly of the ejector units.

Figure 6:
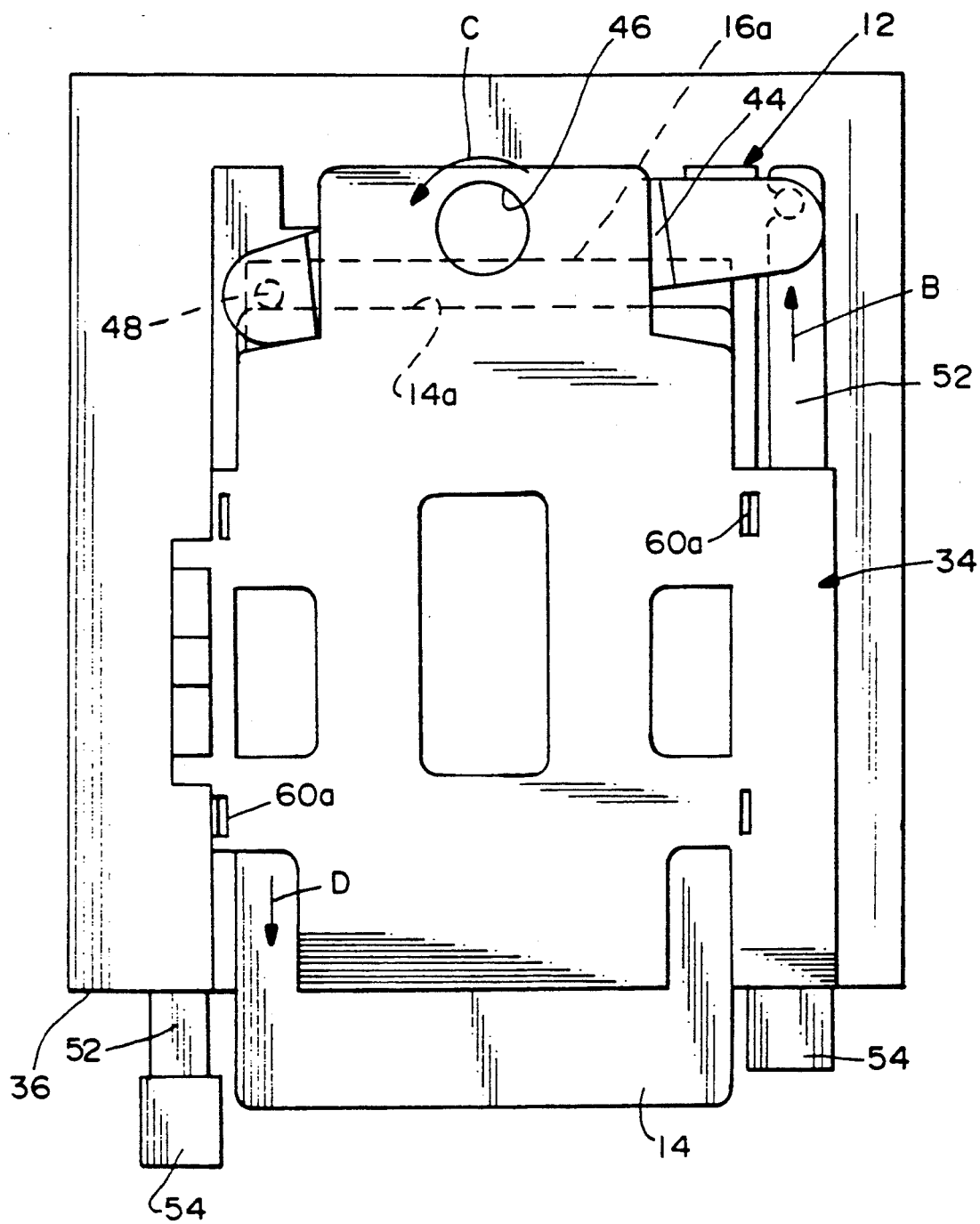
FIG. 6 is a view similar to that of FIG. 5, with the actuator means of one of the ejector units ejecting one of the IC packs.

Lastly, FIG. 6 shows actuator rod 52 of upper ejector unit 34 pushed inwardly in the direction of arrow "B", whereupon ejector lever 44 of the upper ejector unit pivots in the direction of arrow "C" to drive ejector pin 48 against edge 14a of IC pack 14. This drives the IC pack in the direction of arrow "D" to disconnect the socket terminals of the IC pack from pin terminals 26 of upper header connector 22. It can be seen by inner edge 16a of the lower IC pack that the lower IC pack still is fully inserted into the lower header connector 24, with actuator rod 52 and push button 54 of lower ejector unit 36 still in their inoperative conditions.

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein.

We claim:

1. In a connector apparatus for providing interconnection between two IC packs and a printed circuit board, including
    header connector means for mounting on the printed circuit board, into which the two IC packs are inserted and from which they are ejected, and
    ejector means on the header connector means having actuator means for moving the IC packs from inserted positions to ejected positions,
    wherein the improvement in said ejector means comprises:
    two independent ejector units, each having a separate frame adapted to attach to the header connector means and a separate actuator for moving a respective one of the IC packs from its inserted position to its ejected position; and
    complementary interengaging latch means between the separate frames for holding the ejector units in juxtaposition for conjoint attachment to the header connector means.

2. In a connector apparatus as set forth in claim 1, wherein the frames of said ejector units are at least in part molded of dielectric material and said complementary interengaging latch means comprise an integrally molded resilient latch arm projecting from the frame of one ejector unit and a latch surface on the frame of the other ejector unit for latchingly engaging the latch arm.

3. In a connector apparatus as set forth in claim 1, wherein said complementary interengaging latch means comprise a snap-latch device on the frame of one of the ejector units and projecting therefrom, and a latch surface on the frame of the other ejector unit for latchingly engaging the snap-latch device.

4. In a connector apparatus as set forth in claim 2, wherein said ejector units are of identical construction and are positioned in a mirror image configuration, each unit including one of said snap-latch devices and one of said latch surfaces.

5. In a connector apparatus as set forth in claim 4, wherein said frames of the ejector units are at least in part molded of dielectric material, and said snap-latch devices comprise integrally-molded latch arms projecting from the frames.

6. In a connector apparatus as set forth in claim 5, wherein each of said ejector units is generally rectangular, with one end adapted to receive one of the IC packs and an opposite end adapted to be attached to the header connector means, and including one of said integrally-molded latch arms and one of said latch surfaces spaced along opposite sides of the units between the ends thereof.

7. In a connector apparatus for providing interconnection between a plurality of IC packs and an electronic component, including
   connector means coupled to the electronic component and into which the plurality of IC packs are inserted and from which they are ejected, and
   ejector means associated with the connector means for moving the IC packs from inserted positions to ejected positions,
   wherein the improvement comprises:
   said ejector means including a plurality of ejector units each having
   a separate base to be attached to the connector means and a separate actuator for moving a respective one of the IC packs from its inserted position to its ejected position, and
   complementary interengaging latch means between independent ejector units for holding the ejector units in juxtaposition for conjoint attachment to the connector means.

8. A connector apparatus for providing interconnection between two IC packs and a printed circuit board, comprising:
   first and second header connectors mounted on the printed circuit board at an edge thereof and into which two separate IC packs are inserted and from which they are ejected;
   first and second ejector units each having a separate frame to be attached to the first and second header connectors, respectively, each unit further including a separate actuator for moving a respective one of the IC packs from its inserted position to its ejected position; and
   complementary interengaging latch means between the ejector units for holding the ejector units in juxtaposition for conjoint attachment to the header connectors.

9. In a memory card ejector mechanism assembly adapted to be removably attached to two printed circuit board-mounted headers, said ejector mechanism assembly having two ejector mechanisms, each ejector mechanism including:
   a rectangularly-shaped dielectric housing with an opening at one end for receiving a memory card therethrough, and latching means at another end adapted to removably attach to a memory card-receiving connector;
   an eject lever pivotally mounted on the housing movable between an insert position and an eject position; and
   an elongate actuator slidingly mounted in the housing having a first end adapted to engage the eject lever, and a second end with a manually manipulatable pushbutton adapted to effect movement of the eject lever between the insert and the eject positions;
   wherein the improvement in said ejector mechanism assembly comprises:
   a snap latch formed on the housing of one of the ejector mechanisms extending perpendicular therefrom; and
   a corresponding opening formed in the housing of the other of the ejector mechanisms which defines a latching surface for the snap latch;
   whereby upon engagement of the snap latch to the latching surface, the two ejector mechanisms are fixed together to allow facilitated assembly of the ejector mechanism assembly to the two printed circuit board-mounted headers.

10. The ejector mechanism assembly of claim 9 wherein the two ejector mechanisms are of identical construction and are fixed together in a mirror-image configuration.

11. A method of accommodating various thicknesses of a substrate by a given memory card ejector mechanism assembly within a given injection mold,
   the memory card ejector mechanism assembly adapted to provide an interconnection between two memory cards and the substrate, said ejector mechanism assembly comprising:
   header connector means for mounting on the substrate, into which the two memory cards are inserted and from which they are ejected; and
   ejector means associated with the header connector means having actuator means for moving the memory cards from inserted positions to ejected positions, the ejector means including two independent ejector units of identical construction configured in a mirror-image relationship, each having a separate frame to attach to the header connector means and a separate actuator for moving a respective one of the memory cards from its inserted position to its ejected position, and complementary interengaging latch means formed on the frames for fixing the ejector units in juxtaposition to allow facilitated attachment of the ejector means to the header connector means;
   the injection mold including
   a plurality of inserts which define the size of the complementary interengaging latch means, having dimensions which correspond to the various thicknesses of substrates,
   the method comprising the steps of:
   determining the thickness of the substrate on which the header connector means is to be mounted;
   choosing an insert from the plurality of inserts which most closely corresponds to the thickness of the substrate; and
   placing the insert in the mold to selectively produce the complementary interengaging latch means which allows the ejector mechanism assembly to accommodate the substrate thickness.

* * * * *